(12) United States Patent
Shi et al.

(10) Patent No.: US 8,754,442 B2
(45) Date of Patent: Jun. 17, 2014

(54) SILICON ON INSULATOR INTEGRATED HIGH-CURRENT N TYPE COMBINED SEMICONDUCTOR DEVICE

(75) Inventors: Longxing Shi, Jiangsu (CN); Qinsong Qian, Jiangsu (CN); Changlong Huo, Jiangsu (CN); Weifeng Sun, Jiangsu (CN); Shengli Lu, Jiangsu (CN)

(73) Assignee: Southeast University (CN)

( * ) Notice: Subject to any disclaimer, the term of this patent is extended or adjusted under 35 U.S.C. 154(b) by 0 days.

(21) Appl. No.: 13/819,286

(22) PCT Filed: Jul. 11, 2011

(86) PCT No.: PCT/CN2011/077037
§ 371 (c)(1),
(2), (4) Date: Feb. 26, 2013

(87) PCT Pub. No.: WO2012/024986
PCT Pub. Date: Mar. 1, 2012

(65) Prior Publication Data
US 2013/0153956 A1    Jun. 20, 2013

(30) Foreign Application Priority Data
Aug. 27, 2010    (CN) .......................... 2010 1 0266405

(51) Int. Cl.
*H01L 29/76* (2006.01)
(52) U.S. Cl.
USPC .... 257/140; 257/343; 257/367; 257/E29.027; 257/E29.261
(58) Field of Classification Search
None
See application file for complete search history.

(56) References Cited

U.S. PATENT DOCUMENTS

| | | | | |
|---|---|---|---|---|
| 8,129,785 B2* | 3/2012 | Izumi et al. | | 257/343 |
| 8,148,783 B2* | 4/2012 | Nakagawa | | 257/367 |
| 2008/0237706 A1* | 10/2008 | Williams et al. | | 257/343 |
| 2008/0237782 A1* | 10/2008 | Williams et al. | | 257/513 |
| 2010/0187566 A1 | 7/2010 | Jou et al. | | 257/137 |
| 2011/0012196 A1* | 1/2011 | Williams et al. | | 257/343 |

FOREIGN PATENT DOCUMENTS

| | | | | |
|---|---|---|---|---|
| CN | 101714552 | 5/2010 | | H01L 27/06 |
| CN | 101969050 | 2/2011 | | H01L 21/762 |

OTHER PUBLICATIONS

International Search Report issued in corresponding PCT application serial No. PCT/CN2011/077037, dated Oct. 20, 2011, with English translation (6 pgs).

* cited by examiner

*Primary Examiner* — Minh-Loan T Tran
*Assistant Examiner* — Fazli Erdem
(74) *Attorney, Agent, or Firm* — Hayes Soloway P.C.

(57) ABSTRACT

A silicon on insulator N type semiconductor device, includes a N type drift region, a P type deep well, an N type buffer well, a P type drain region, an N type source region and a P type body contact region; a field oxide layer and a gate oxide layer arranged on a silicon surface, and a polysilicon lattice arranged on the gate oxide layer; and an N type triode drift region, a P type deep well, an N type triode buffer well, a P type emitting region, an N type base region, an N type source region and a P type body contact region; a field oxide layer and a gate oxide layer arranged on a silicon surface, and a polysilicon lattice arranged on the gate oxide layer.

9 Claims, 7 Drawing Sheets

SILICON ON INSULATOR INTEGRATED HIGH-CURRENT N TYPE COMBINED SEMICONDUCTOR DEVICE

FIELD OF THE INVENTION

The present invention relates to the domain of high voltage power semiconductor devices, in particular to a SOI (Silicon on Insulator) integratable high-current N-type combined semiconductor device that can improve current density for high voltage applications.

BACKGROUND OF THE INVENTION

As people's demand for modern life is increasingly higher, more and more attention is paid to the performance of power semiconductor devices, wherein, the integratability, high withstand voltage and high current, and outstanding isolation capability from the low-voltage circuit part are top technical requirements for power semiconductor devices. Besides the type of power semiconductor device, the structure and manufacturing technique of power semiconductor device are also important influencing factors for high voltage and high current processing capability of a power integratable circuit.

Through the years, commonly used power semiconductor devices were high-voltage triodes and high-voltage insulated-gate field-effect transistors (IGFETs). These two types of devices brought many adverse effects to power integratable circuits, though they essentially met people's demand for high withstand voltage and integratability. The drawbacks of high voltage triodes mainly include low input impedance and low switching speed. Though high-voltage IGFETs have high input impedance, their current driving capability is very limited; in addition, there is an inevitable contradiction between the high withstand voltage and the turn-on impedance in high-voltage IGFETs.

As science and technology develop, insulated-gate bipolar type devices emerged and met most of people's demand for power semiconductor devices. Insulated-gate bipolar devices integrate the advantages of high-voltage triodes and IGFETs, and have performances such as high input impedance, high switching speed, high withstand voltage, high current driving capability, and low turn-on impedance, etc. However, the insulated-gate bipolar devices developed in the early stage were longitudinal devices, which had poor integratability. Lateral insulated-gate bipolar devices that emerged later overcame the problem.

After the requirements for integratability, high withstand voltage and high current of power semiconductor devices are met, the isolation capability of power semiconductor devices became the main contradiction. In the bulk silicon process, since the high voltage circuit and the low voltage circuit are integratable in the same chip, the drain current of the high voltage circuit is high and leaks into the low voltage circuit through the substrate, causing the low voltage circuit latched up and the chip burnt finally. To solve that problem, a SOI technique was put forward.

With the emergence of SOI technique, the isolation problem of power semiconductor devices was solved effectively. Up to now, SOI lateral insulated-gate bipolar devices have become the main devices of power semiconductor devices, and are widely applied in the domain of 600V Dc voltage or above conversion systems, such as AC motors, frequency converters, switching power supplies, lighting circuits, and traction driving devices, etc.

A major problem related with SOI lateral insulated-gate bipolar devices is: compared to longitudinal devices, the current density is not high enough; therefore, high current driving capability is obtained often by increasing the area of the device; as a result, the chip area is severely consumed and the cost is increased. The present invention introduces a novel SOI integratable high-current N-type combined semiconductor device, which can improve current density significantly without increasing the layout area, when compared to conventional SOI N-type lateral insulated-gate bipolar type devices of the same size, current density increased significantly.

SUMMARY OF THE INVENTION

The present invention provides a SOI integratable high-current N-type combined semiconductor device that can effectively improve current density of device without changing the device area.

The present invention employs the following technical scheme:

A SOI integratable high-current N-type combined semiconductor device, comprising: a P-type silicon substrate, a buried oxide layer arranged on the P-type silicon substrate, a P-type deep trench arranged above the center of the buried oxide layer, and an N-type annular source region and a P-type body contact region arranged on the P-type deep trench, wherein, the N-type annular source region surrounds outside of the P-type body contact region, and a piece of source electrode metal is arranged on the N-type source region and the P-type body contact region, designed to interconnect the N-type source region and the P-type body contact region; a first isolation region and a second isolation region are arranged on the buried oxide layer, and the first and second isolation regions extend towards the center of the buried oxide layer and thereby define a first region T and a second region II; an N-type lateral insulated-gate bipolar transistor is arranged in the first region I, and a PNP high-voltage bipolar transistor and an N-type lateral double-diffused metal oxide layer field-effect transistor are arranged in the second region II, wherein, the source region of the N-type lateral insulated-gate bipolar transistor employs the N-type annular source region, the collector region of the PNP-type high-voltage bipolar transistor employs the P-type body contact region, the source region of the N-type lateral double-diffused metal oxide layer field-effect transistor employs the N-type annular source region, and the P-type body contact region is also used as the body contact region of the N-type lateral insulated-gate bipolar transistor; a piece of drain electrode metal connected to the drain electrode of the N-type lateral insulated-gate bipolar transistor is connected with a piece of base electrode metal connected to the base electrode of the PNP-type high-voltage bipolar transistor by a metal layer.

Compared to the prior art, the present invention has the following advantages:

(1) The device in the present invention is separated into two parts by isolation trenches on the basis of the original layout in the prior art, wherein, one part is used to produce a conventional N-type lateral insulated-gate bipolar transistor, and the other part is used to produce a PNP-type high-voltage bipolar transistor and a conventional N-type high-voltage lateral double-diffused metal oxide layer field-effect transistor; in addition, the drain electrode of the N-type lateral insulated-gate bipolar transistor is connected with the base electrode of the PNP-type high-voltage bipolar transistor via a metal layer, so that the drain current of the former can be effectively used as the base current flowing through the PNP-type high-voltage bipolar transistor for further amplification; moreover, the current of the conventional N-type lateral double-diffused metal oxide layer field-effect transistor that is in the same region as the PNP-type high-voltage bipolar transistor is amplified, so as to improve the current density in the entire device. The equivalent circuit diagram of the semiconductor combined device is shown in FIG. 4, and the comparison of current density between the semiconductor combined device in the present invention and a conventional N-type insulated-gate bipolar device with the same area is shown in FIG. 5. It is seen from the figure: the current density in the semiconductor combined device in the present invention is much higher than the current density in the conventional N-type insulated-gate bipolar device.

(2) Compared to conventional devices, the device according to in the present invention improves current density without changing the original layout area of the device.

(3) A benefit of the device according to the present invention is: the current density is improved, while there is no adverse effect on the voltage withstand level of the device, which is to say, the basic performances of the device still meets the demand. FIG. 6 shows the comparison of Off-state breakdown voltage between the semiconductor combined device according to the present invention and a conventional N-type insulated-gate bipolar transistor with the same area. It can be seen from the figure that the Off-state breakdown voltage of the semiconductor combined device according to the present invention matches that of the conventional N-type insulated-gate bipolar device with the same area.

(4) The device according to the present invention doesn't require any additional process steps, and is fully compatible to the existing IC manufacturing process.

DETAILED DESCRIPTION OF THE EMBODIMENTS

Figure 1:
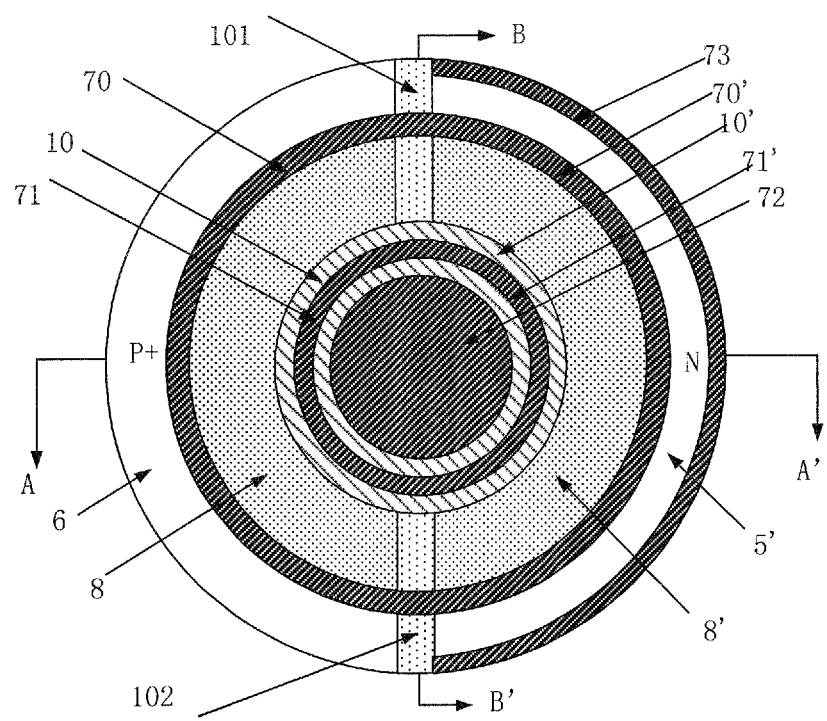
FIG. 1(a) is a top view of the combined semiconductor device according to the present invention, with the passivation protected oxide layer removed.
FIG. 1(b) is a sectional view along the surface AN in FIG. 1(a) (with the passivation protected oxide layer).
FIG. 1(c) is a sectional view along the surface BB' in FIG. 1(a) (with the passivation protected oxide layer).
Figure 1:
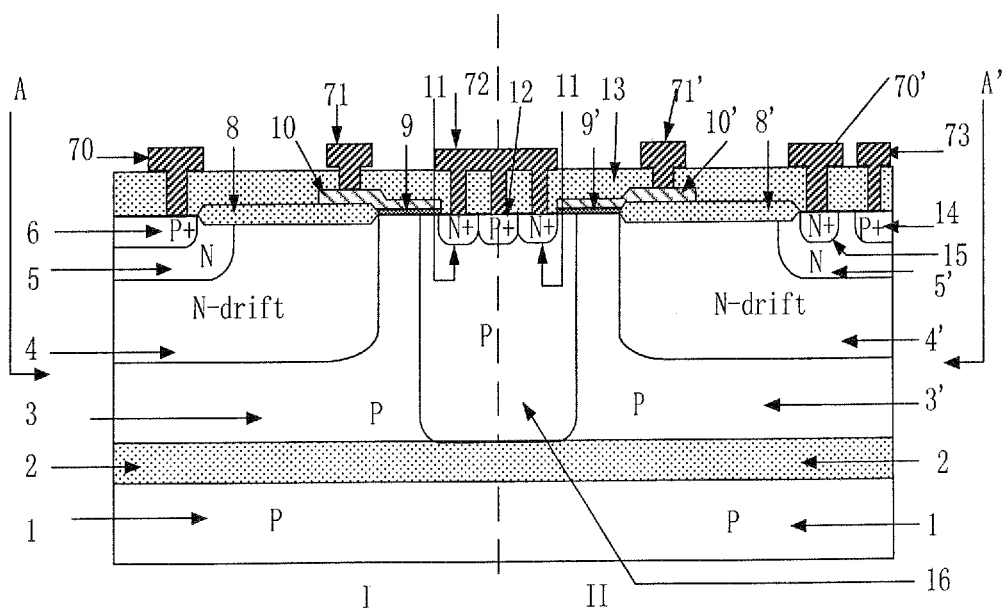
Figure 1:
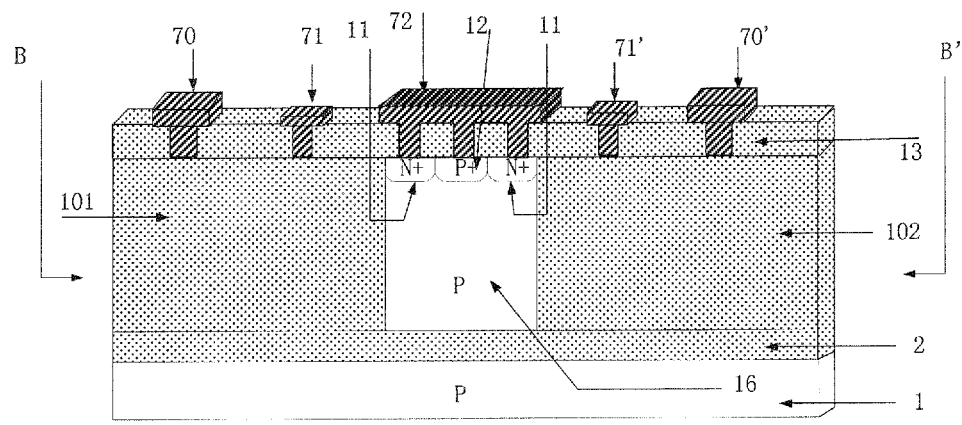
Figure 2:
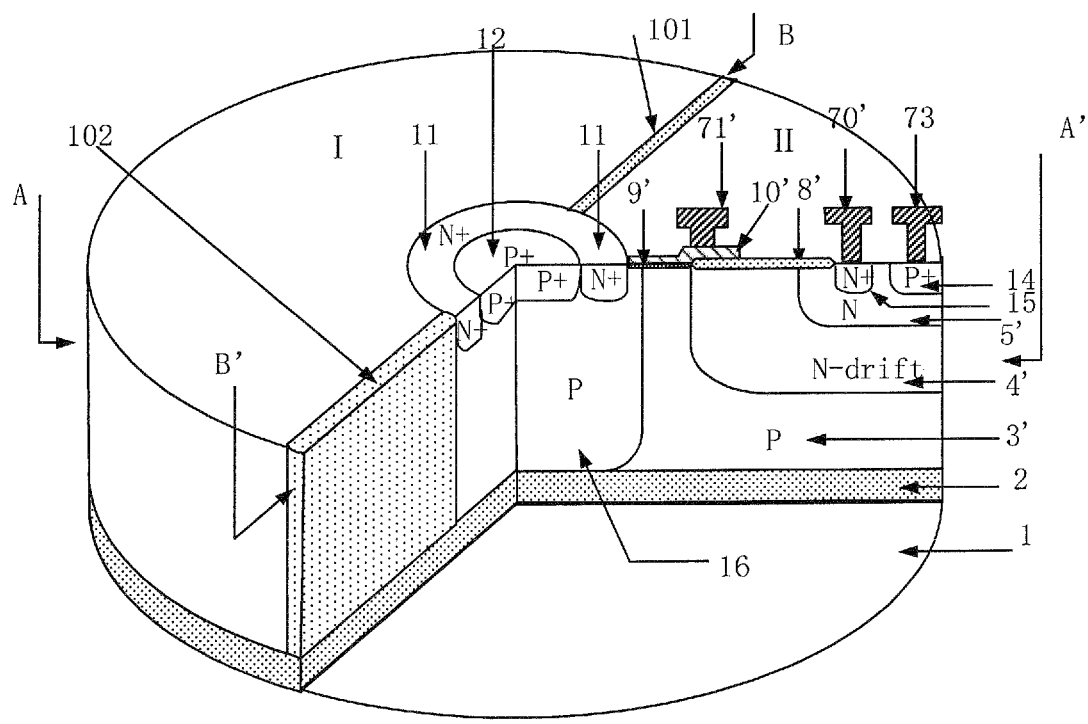
FIG. 2 is a 3D structural diagram of the combined semiconductor device according to the present invention (with the passivation protected oxide layer and a part of the metal removed).
Figure 3:
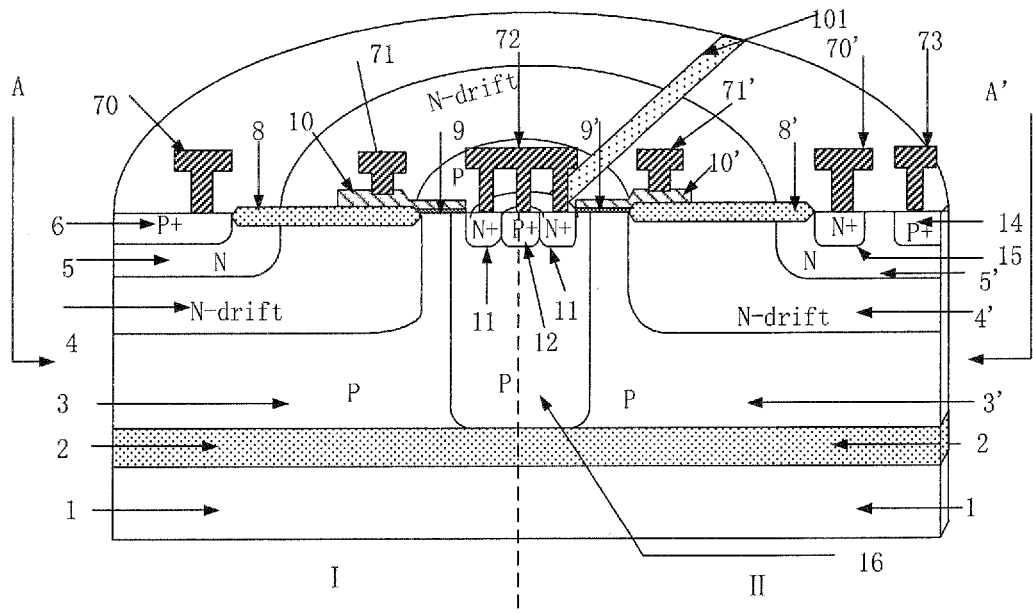
FIG. 3 is a 3D sectional view along surface AA' of the combined semiconductor device according to the present invention (with the passivation protected oxide layer and a part of the metal removed).
Figure 4:
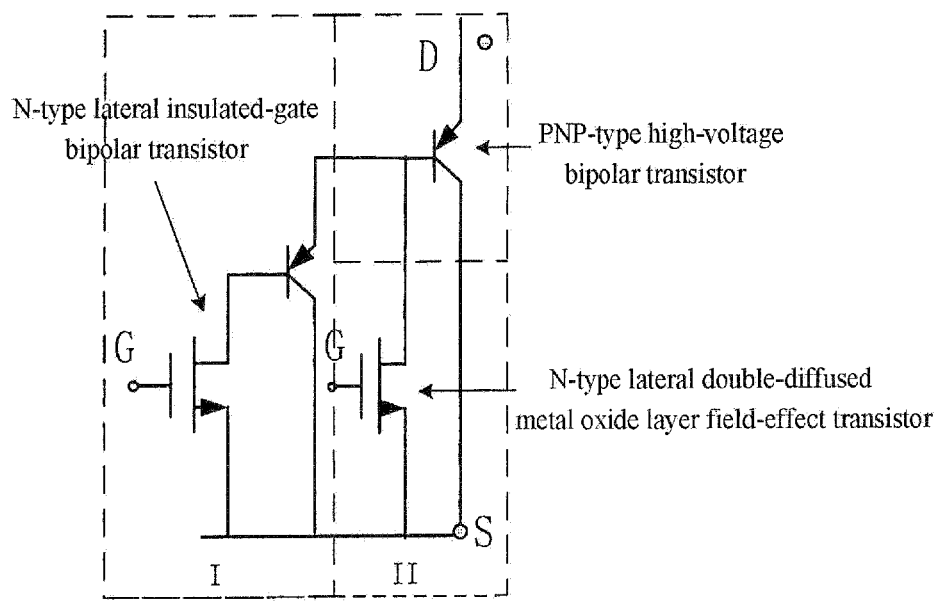
FIG. 4 is an equivalent circuit diagram of the semiconductor combined device according to the present invention.
Figure 5:
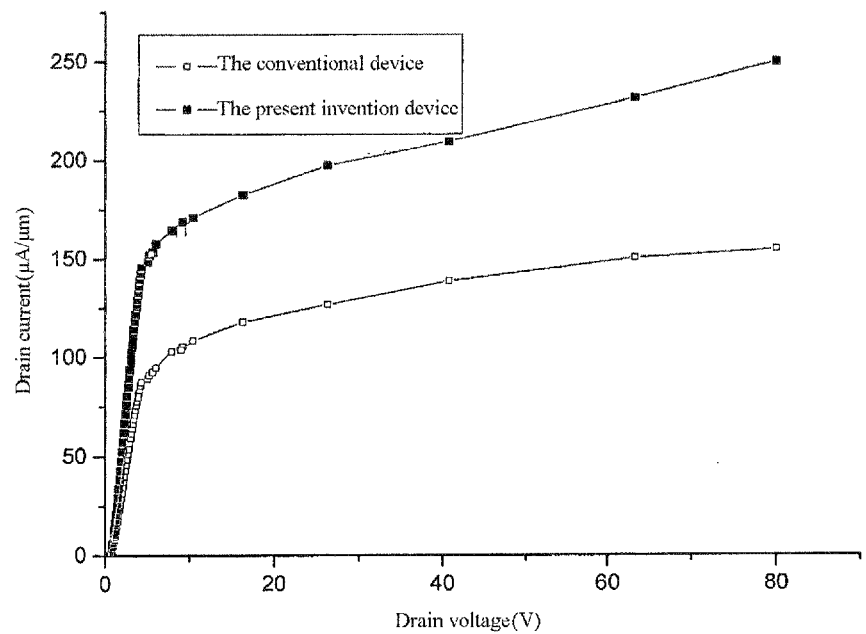
FIG. 5 shows the comparison of drain current density between the semiconductor combined device according to the present invention and a conventional N-type insulated-gate bipolar device with the same area.
Figure 6:
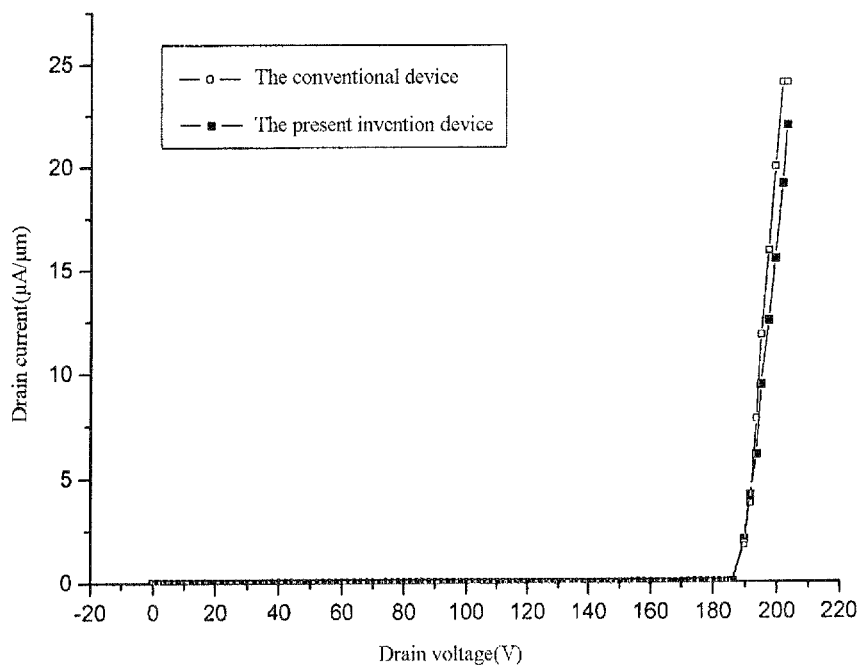
FIG. 6 shows the comparison of Off-state breakdown voltage between the semiconductor combined device according to the present invention and a conventional N-type insulated-gate bipolar device with the same area.
Figure 7:
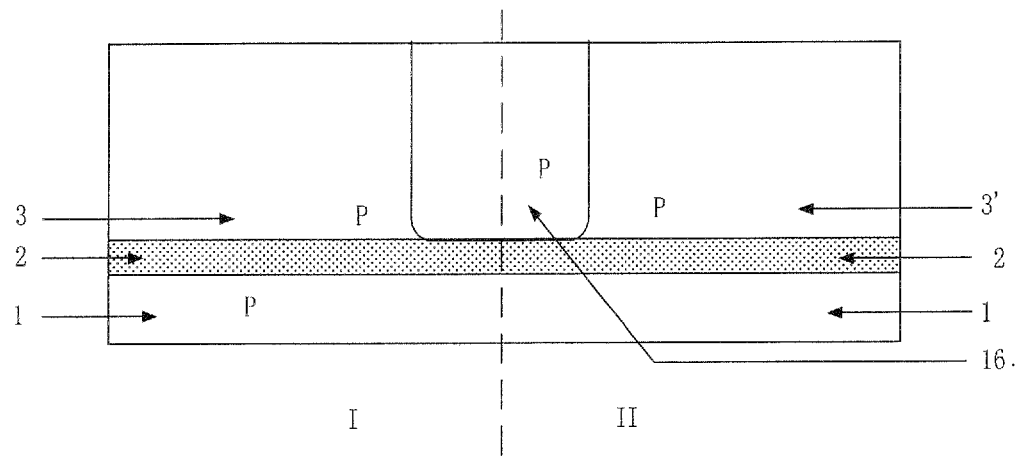
FIG. 7(a) is a schematic diagram of the process for forming the P-type deep trench 16 in the semiconductor combined device according to the present invention.
FIG. 7(b) is a schematic diagram of the process for forming an N-type drift region 4 in the first region (I) and an N-type triode drift region 4' in the second region (II) in the semiconductor combined device according to the present invention.
FIG. 7(c) is a schematic diagram of process for forming an N-type buffer trench 5 at the top-left part of the N-type drift region 4 and a N-type triode buffer trench 5' at the top-right part of the N-type triode drift region 4' in the semiconductor combined device according to the present invention.
FIG. 7(d) is a schematic diagram of process for forming a field oxide layer 8, agate oxide layer 9, and a polysilicon gate 10 in the first region (I) and a field oxide layer 8', a gate oxide layer 9', and a polysilicon gate 10' in the second region (II) in the semiconductor combined device according to the present invention.
FIG. 7(e) is a schematic diagram of process for forming P-type drain region 6. P-type emitting region 14, N-type base region 15, P-type body contact region 12, and N-type annular source region 11 in the semiconductor combined device according to the present invention.
FIG. 7(f) is a sectional view along surface AA' in FIG. 1(a) after the semiconductor combined device according to the present invention is formed completely.
Figure 7:
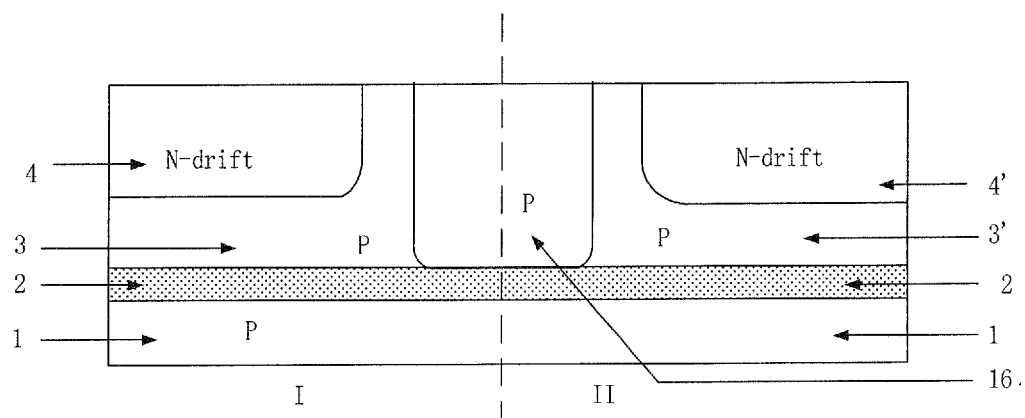
Figure 7:
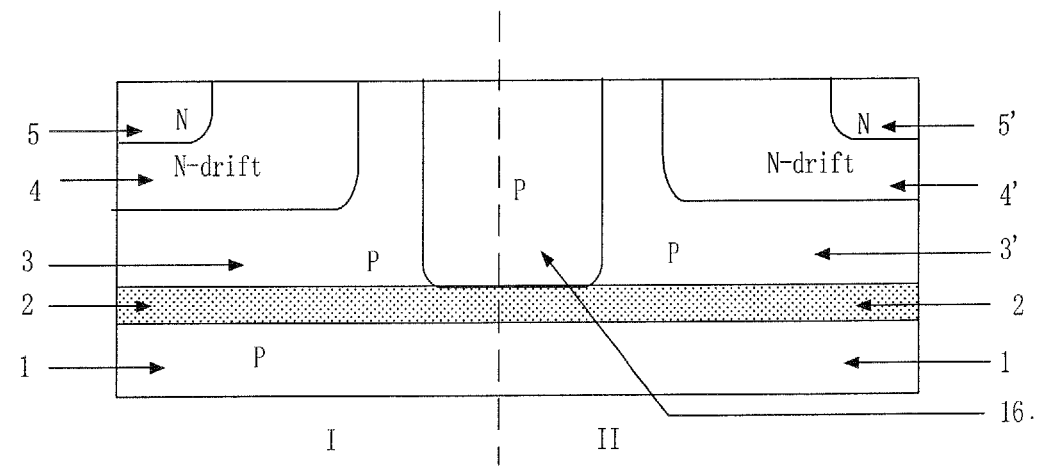
Figure 7:
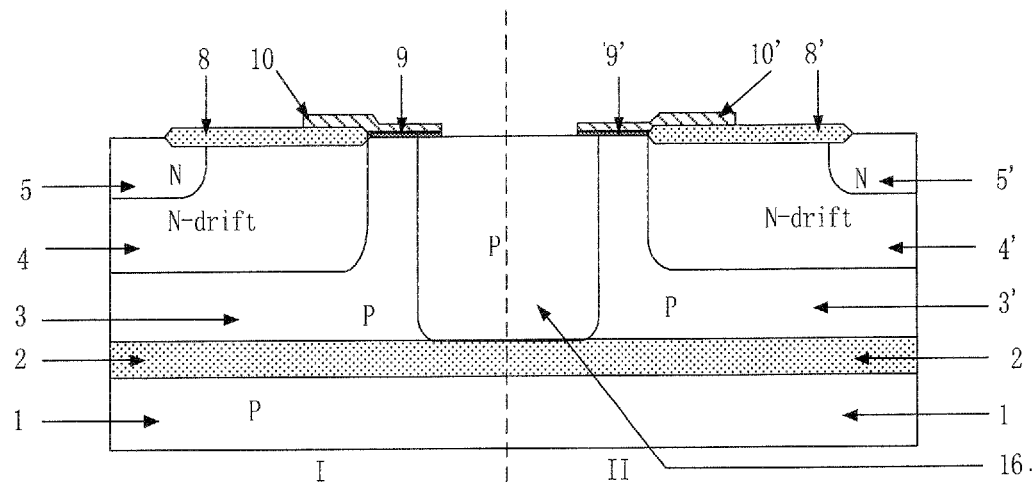
Figure 7:
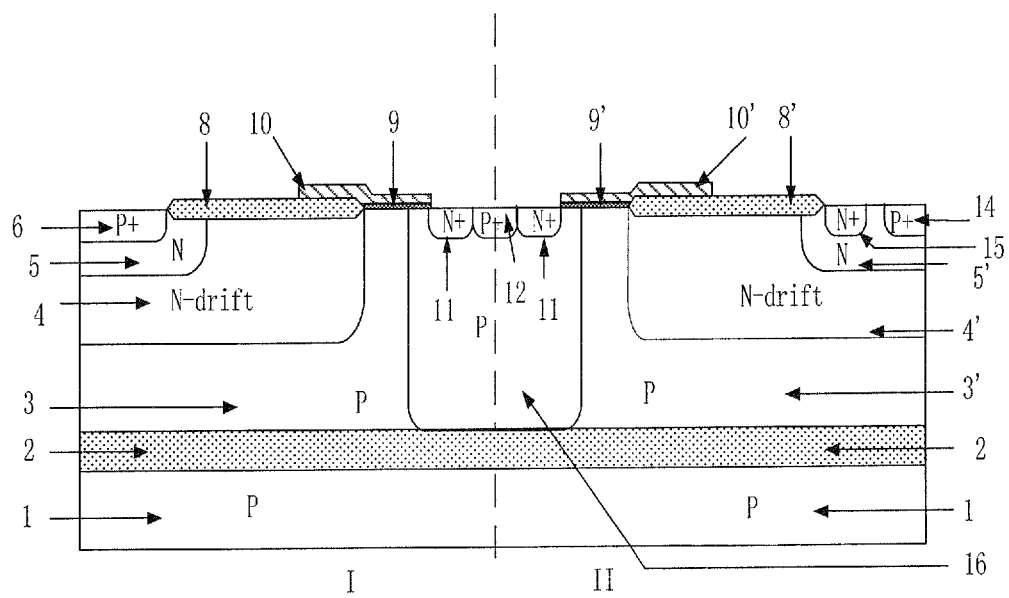
Figure 7:
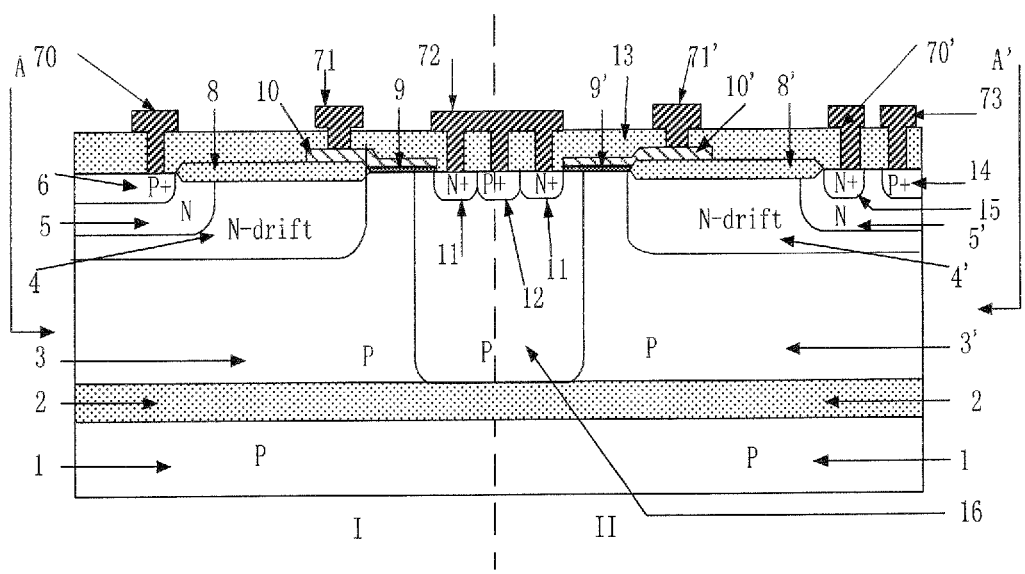

A SOI integratable high-current N-type combined semiconductor device, comprising: a P-type substrate 1; a buried oxide layer 2 arranged on the P-type substrate 1; a P-type deep trench 16 arranged above the center of the buried oxide layer 2; an N-type annular source region 11 and a P-type body contact region 12 arranged on the P-type deep trench 16, wherein, the N-type annular source region 11 surrounds outside of the P-type body contact region, and a piece of source electrode metal 72 is arranged on the N-type annular source region 11 and the P-type body contact region 12, designed to interconnect the N-type annular source region 11 and the P-type body contact region 12; a first isolation region 101 and a second isolation region 102 are further arranged on the buried oxide layer 2, and the first isolation region 101 and the second isolation region 102 extend towards the center of the buried oxide layer 2 and thereby define a first region I and a second region II; an N-type lateral insulated-gate bipolar transistor is arranged in the first region I, and a PNP-type high-voltage bipolar transistor and an N-type lateral double-diffused metal oxide layer field-effect transistor are arranged in the second region 11, wherein, the source region of the N-type lateral insulated-gate bipolar transistor employs the N-type annular source region 11, the collector region of the PNP-type high-voltage bipolar transistor employs the P-type body contact region 12, the source region of the N-type lateral double-diffused metal oxide layer field-effect transistor employs the N-type annular source region 11, and the P-type body contact region 12 is also used as the body contact region of the N-type lateral insulated-gate bipolar transistor; a piece of drain electrode metal 70 connected to the drain electrode of the N-type lateral insulated-gate bipolar transistor is connected with a piece of base electrode metal 70' connected to the base electrode of the PNP-type high-voltage bipolar transistor by a metal layer.

The included angle formed between the first isolation region 101 and the second isolation region 102 is adjustable; however, in the two regions separated and formed by extension of the first isolation region 101 and the second isolation region 102 towards the center of the buried oxide layer 2, the region enclosed by obtuse angles must be region I, and the region enclosed by acute angles must be region II.

Though the structure of the semiconductor combined device is implemented in a round layout as illustrated in the drawings, the implementation of the present invention is not limited to round shape, for example, alternatively, the present invention can be implemented in a runway type or a rectangular shape, etc., as long as the region I and region II are separated from each other by two isolation trenches 101 and 102 and the drain electrode of the N-type lateral insulated-gate bipolar device is connected with the base electrode of the PNP-type high-voltage transistor through a piece of metal.

The spacing between the P-type emitting region 14 and the N-type base region 15 of the SOT integratable high-current N-type semiconductor combined device is 1 μm~2 μm.

The device in the present invention is produced with the following method:

Step 1: take a piece of SOI wafer with a P-type epitaxial layer, etch out required isolation trenches 101 and 102 to form a first region 1 and a second region II and divide the P-type epitaxial layer into a first P-type epitaxial layer 3 in the first region I and a second P-type epitaxial layer 3' in the second region II.

Step 2: form a P-type deep trench 16 by high-energy boron ion implantation and high temperature annealing.

Step 3: form an N-type drift region 4 in the first region I and an N-type triode drift region 4' in the second region II by high-energy phosphorus ion implantation and high temperature annealing.

Step 4: form an N-type buffer trench 5 at the top-left part of the N-type drift region 4 and an N-type triode buffer trench 5' at the top-right part of the N-type triode drift region 4' by high-energy phosphorus ion implantation and high temperature annealing.

Step 5: deposit and etch a silicon nitride, and grow a field oxide layer at high temperature. Regrow a gate oxide layer, and deposit a polysilicon and etch out a polysilicon gate.

Step 6: produce electrode contact regions by high-dose boron ion implantation and phosphorus ion implantation.

Step 7: deposit a silicon dioxide, etch out electrode contact holes and then deposit a metal lead layer, and etch off excessive metal.

Step 8: produce a passivation layer.

The invention claimed is:

1. A SOI integratable high-current N-type combined semiconductor device, comprising: a P-type silicon substrate (1); a buried oxide layer (2) arranged on the P-type silicon substrate (1); characterized in that a P-type deep trench (16) arranged above the center of the buried oxide layer (2); an N-type annular source region (11) and a P-type body contact region (12) arranged on the P-type deep trench (16), wherein, the N-type annular source region (11) surrounds outside of the P-type body contact region (12), and a piece of source electrode metal (72) is arranged on the N-type source region (11) and the P-type body contact region (12), designed to interconnect the N-type source region (11) and the P-type body contact region (12); a first isolation region (101) and a second isolation region (102) are arranged on the buried oxide layer (2), and the first isolation region (101) and second isolation region (102) extend towards the center of the buried oxide layer (2) and thereby define a first region (I) and a second region (II); an N-type lateral insulated-gate bipolar transistor is arranged in the first region (I), and a PNP-type high-voltage bipolar transistor and an N-type lateral double-diffused metal oxide layer field-effect transistor are arranged in the second region (II), wherein, the source region of the N-type lateral insulated-gate bipolar transistor employs the N-type annular source region (11), the collector region of the PNP-type high-voltage bipolar transistor employs the P-type body contact region (12), the source region of the N-type lateral double-diffused metal oxide layer field-effect transistor employs the N-type annular source region (11), and the P-type body contact region (12) is also used as the body contact region of the N-type lateral insulated-gate bipolar transistor; a piece of drain electrode metal (70) connected to the drain electrode of the N-type lateral insulated-gate bipolar transistor is connected with a piece of base electrode metal (70') connected to the base electrode of the PNP-type high-voltage bipolar transistor by a metal layer.

2. The SOI integratable high-current N-type combined semiconductor device according to claim 1, wherein, the region (1) comprises: a first P-type epitaxial layer (3) arranged on the buried oxide layer (2); an N-type drift region (4) arranged on the top-left part of the first P-type epitaxial layer (3); an N-type buffer trench (5) arranged on the top-left part of the N-type drift region (4); a P-type drain region (6) arranged on the top-left part of the N-type buffer trench (5), with the drain electrode metal (70) arranged above the P-type drain region (6); a field oxide layer (8) arranged on the silicon surface of the N-type drift region (4) and connected with the P-type drain region (6); a gate oxide layer (9) arranged on the silicon surface between the N-type annular source region (11) and the field oxide layer (8); a polysilicon gate (10) arranged on the gate oxide layer (9) and extending to the upper surface of the field oxide layer (8); and, a piece of gate electrode metal (71) arranged on the polysilicon gate (10).

3. The SOI integratable high-current N-type combined semiconductor device according to claim 1, wherein, the region (II) comprises: a second P-type epitaxial layer (3') arranged on the buried oxide layer (2); an N-type triode drift region (4') arranged on the top-right part of the second P-type epitaxial layer (3'); an N-type triode buffer trench (5') arranged on the top-right part of the N-type triode drift region (4'); a P-type emitting region (14) and an N-type base region (15) arranged from right to left on the N-type triode buffer trench (5'); a piece of emitting electrode metal (73) arranged on the P-type emitting region (14), with the base electrode metal (70') arranged on the N-type base region (15); a field oxide layer (8') arranged on the silicon surface of the N-type triode drift region (4') and connected with the N-type base region (15); a gate oxide layer (9') arranged on the silicon surface between the N-type annular source region (11) and the field oxide layer (8'); a polysilicon gate (10') arranged on the gate oxide layer (9') and extending to the upper surface of the field oxide layer (8'); and, a piece of gate electrode metal (71') arranged on the polysilicon gate (10').

4. The SOI integratable high-current N-type combined semiconductor device according to claim 1, wherein, the spacing between the P-type emitting region (14) and the N-type base region (15) is 1 μm~2 μm.

5. The SOI integratable high-current N-type combined semiconductor device according to claim 1, wherein, a passivation protected oxide layer (13) is arranged in the non-metal region of the upper surface of the first region (1) and second region (II) respectively.

6. The SOI integratable high-current N-type combined semiconductor device according to claim 2, wherein, the spacing between the P-type emitting region (14) and the N-type base region (15) is 1 μm~2 μm.

7. The SOI integratable high-current N-type combined semiconductor device according to claim 2, wherein, a passivation protected oxide layer (13) is arranged in the non-metal region of the upper surface of the first region (1) and second region (II) respectively.

8. The SOI integratable high-current N-type combined semiconductor device according to claim 3, wherein, the spacing between the P-type emitting region (14) and the N-type base region (15) is 1 μm~2 μm.

9. The SOI integratable high-current N-type combined semiconductor device according to claim 3, wherein, a passivation protected oxide layer (13) is arranged in the non-metal region of the upper surface of the first region (1) and second region (II) respectively.

* * * * *